(12) United States Patent
Kim et al.

(10) Patent No.: US 6,495,947 B1
(45) Date of Patent: Dec. 17, 2002

(54) PIEZOELECTRIC CERAMIC COMPOSITION, AND HIGH POWER OUTPUT TRANSFORMER MADE OF THE SAME COMPOSITION

(75) Inventors: Jong Sun Kim, Kyungki-do (KR); Choong Sik Yoo, Kyungki-do (KR); Joo Hyun Yoo, Choongchungbook-do (KR); Yong Woo Lee, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 21 days.

(21) Appl. No.: 09/723,672

(22) Filed: Dec. 5, 2000

(30) Foreign Application Priority Data

May 4, 2000 (KR) ........................................ 2000-23901

(51) Int. Cl.[7] .............................................. H01L 41/08
(52) U.S. Cl. ...................... 310/358; 310/359; 252/62.9
(58) Field of Search ................................ 310/358, 659, 310/366; 252/62.9

(56) References Cited

U.S. PATENT DOCUMENTS

| | | | | | |
|---|---|---|---|---|---|
| 4,367,426 A | * | 1/1983 | Kumada et al. | ............ | 310/358 |
| 4,876,148 A | * | 10/1989 | Virkar | ......................... | 428/384 |
| 6,104,128 A | * | 8/2000 | Fujii et al. | .................... | 310/358 |
| 6,118,209 A | * | 9/2000 | Okuyama et al. | ........... | 310/358 |
| 6,288,479 B1 | * | 9/2001 | Watanabe | .................... | 310/359 |

* cited by examiner

Primary Examiner—Mark O. Budd
(74) Attorney, Agent, or Firm—Lowe Hauptman Gilman Berner, LLP

(57) ABSTRACT

A piezoelectric ceramic composition in which the mechanical quality factor Qm and the electromechanical coupling factor Kp are superior, and a high power output piezoelectric transformer made of it are disclosed.

The piezoelectric ceramic composition according to the present invention is composed of $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, where a is 0–0.06 mol %, b is 0.01–0.05 mol %, c is 0.01–0.09 mol %, x is 0.47–0.53 mol %, and k is 0.1–0.7 wt %.

The piezoelectric transformer according to the present invention includes: a piezoelectric block composed of the same composition; a first electrode consists of an inner electrode and an outer electrode, the inner electrode being formed at a center of a top of the piezoelectric block, and the outer electrode being formed around the inner electrode by being separated by an isolating region; a second electrode is formed on the bottom of the piezoelectric block.

10 Claims, 4 Drawing Sheets

PIEZOELECTRIC CERAMIC COMPOSITION, AND HIGH POWER OUTPUT TRANSFORMER MADE OF THE SAME COMPOSITION

BACKGROUND OF THE INVENTION

1. Field of the Invention

The present invention relates to a piezoelectric ceramic composition for use in a piezoelectric transformer and the like. Particularly, the present invention relates to a piezoelectric ceramic composition in which the mechanical-quality factor Qm and the electromechanical coupling factor Kp are superior, and to a high power output piezoelectric transformer made of the same composition.

2. Description of the Prior Art

The discovery of the piezoelectric ceramic was such that $BaTiO_3$ was discovered at the middle of 1940s, and then, $Pb(Zr,Ti)O_3$ (to be called simply "PZT" below) having more superior piezoelectric properties was developed thereafter. This material has been widely applied to high voltage generators, ultrasonic apparatuses, sound apparatuses, communication apparatuses, and various other sensors.

PZT is a solid solution form of $PbZrO_3$ and $PbTiO_3$, and has a perovskite structure, while it has superior piezoelectric properties. In order to make the composition variation easier than this two-component system and to improve the piezoelectric properties, there have been developed three-component system composite perovskite compounds. Among these three-component system compounds, attention has been focused on: $Pb(Mg,Nb)O_3$—$Pb(Zr,Ti)O_3$, $Pb(Mg,Ta)O_3$—$Pb(Zr,Ti)O_3$, and $Pb(Mn,Nb)O_3$—$Pb(Zr,Ti)O_3$.

Recently there has been reported a piezoelectric ceramic composition in which the coercive electric field and the electromechanical factor are high, and the grain size is made fine by a composition system of $Pb_{0.94}Ba_{0.06})(Mn_{1/3}Nb_{2/3})_{0.075}(Zr_{0.52}Ti_{0.48})_{0.925}O_3 + 0$–$2$ mol % $CeO_2$ (Dielectric constant=799, Qm=1,285, Kp=0.54, Ec=10.7 KV/cm, Tc=332° C., grain size=2.57 $\mu$m, J. H. Yoo; Journal of Korean Electric Academy, 48C, No. 9, P811, 1999). These three-component system piezoelectric ceramic compositions are low in the dielectric constant and in the mechanical quality factor, and therefore, the use of them is limited to the low current output apparatuses such as the inverter of the cold cathode ray tube for illuminating the rear face of the LCD display. Their power is in the order of 2–3 watts, and therefore, they cannot be used in the general fluorescent lamps which consume a considerable amount of electric current.

The impedance of the general fluorescent lamps is as low as several hundred $\Omega$ to several $\Omega$ when lighted, whereas their output power is high i.e., in the order of 10–100 watts. If the piezoelectric ceramic material is to be used for a high power, first the generation of heat, the non-linearity, the degradation of the piezoelectric properties and the mechanical strength have to be solved. In order to achieve this, first the mechanical quality factor and the electromechanical coupling factor have to be high even under a high input power, so that the energy conversion efficiency can be improved to decrease the internal loss so as to decrease the thermal radiation. Second, the mechanical oscillations are high, and therefore, the grain size has to be made fine, thereby increasing the mechanical strength.

If the piezoelectric material is to be used in the transformer for a high power. fluorescent lamp, then the structure of the transformer as well as the physical properties of the material is important. FIG. 1 illustrates a typical example of a piezoelectric transformer which is used in an inverter. This transformer is the Rosen type in which the thickness oscillations and the lengthwise oscillations are utilized. In the transformer 10 of FIG. 1, a pair of input electrodes 14 are respectively formed on the bottom and top of a piezoelectric block 12, and the input electrodes 14 are polarized in the thickness direction. An output part consists of an electrode 16 which is disposed on a side of the piezoelectric block, and is polarized in the lengthwise direction. If the piezoelectric transformer is to be stepped up, then an ac voltage corresponding to the resonance frequency is supplied to the input electrodes 14. Then the supplied electrical signals are converted to strong mechanical oscillations in the thickness direction near the input electrodes of the piezoelectric block 12. These oscillations lead to lengthwise oscillations of the output side, and consequently, a stepped-up high voltage with a frequency same as the input frequency is outputted through the output electrode 16. The stepping-up of the voltage becomes maximum when the frequency of the input voltage is same as the oscillation frequency of the output side. Under this condition, the ratio of the stepping-up of the piezoelectric transformer depends on the impedance of the load. That is, if a low impedance of load is connected to the output side, the ratio of the stepping-up becomes less than several scores. The magnitude of the load impedance is different depending on the kind of lamps in the case where the piezoelectric transformer is used in the cold cathode ray tube or in the fluorescent lamp. However, if the piezoelectric transformer is manufactured at the optimum conditions, then a high stepping-up ratio can be maintained. Thus in the normal case where a high impedance is connected before the lighting, and where the load impedance is lowered after the lighting, a sufficient stepping-up ratio can be maintained, so that it can be used in the cold cathode ray tube or in the fluorescent lamp.

Recently, there has been known a filter 10 in which the oscillation mode is as shown in FIG. 2. An input electrode 14 is formed on the top of a piezoelectric block 12, and an output electrode 16 is formed around the input electrode 14 keeping a certain distance from the latter. On the bottom of the piezoelectric block 12, there is formed a second electrode 18 which is a common electrode. If a voltage is supplied into the input electrode 14, then the supplied electrical signals are converted to mechanical oscillations from the center toward the peripheral portions, and then, output signals proportional to the mechanical oscillations are outputted through the output electrode 16. However, if this structure is used in a high power apparatus, then stress is imposed on the middle of the edge portions, with the result that the device is damaged or its efficiency is degraded.

As described above, if the piezoelectric ceramic is to be used in a high output power apparatus, then the problems of the mechanical quality factor Qm and the electromechanical coupling factor Kp have to be solved first, and a proper structure of the transformer has to be provided also.

SUMMARY OF THE INVENTION

The present invention is intended to solve the above described problems of the conventional techniques.

Therefore it is an object of the present invention to provide a piezoelectric ceramic composition in which the dielectric constant, the electromechanical coupling factor and the mechanical quality factor are superior, and a high output power piezoelectric transformer obtained by using the piezoelectric ceramic composition.

It is another object of the present invention to provide a high output power piezoelectric transformer, in which the piezoelectric ceramic composition is used to construct the transformer so that a high output power characteristics are satisfied, and the operation is stable, by designing particular electrodes.

In achieving the above objects, the piezoelectric ceramic composition according to the present invention includes: $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, where a is 0–0.06 mol %, b is 0.01–0.05 mol %, c is 0.01–0.09 mol %, x is 0.47–0.53 mol %, and k is 0.1–0.7 wt %.

In another aspect of the present invention, the high output power piezoelectric transformer according to the present invention obtained by using a piezoelectric ceramic composition satisfying $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, where a is 0–0.06 mol %, b is 0.01–0.05 mol %, c is 0.01–0.09 mol %, x is 0.47–0.53 mol %, and k is 0.1–0.7 wt %.

In still another aspect of the present invention, the high output power piezoelectric transformer according to the present invention includes: a piezoelectric block composed of $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, (where a is 0–0.06 mol %, b is 0.01–0.05 mol %, c is 0.01–0.09 mol %, x is 0.47–0.53 mol %, and k is 0.1–0.7 wt %.); a first electrode consisting of an inner electrode and an outer electrode, the inner electrode being formed at a center of a top of the piezoelectric block, and the outer electrode being formed around the inner electrode by being separated by an isolating region; and a second electrode formed on the bottom of the piezoelectric block.

BRIEF DESCRIPTION OF THE DRAWINGS

The above objects and other advantages of the present invention will become more apparent by describing in detail the preferred embodiment of the present invention with reference to the attached drawings in which:

FIG. 1 is a schematic view of the conventional Rosen type piezoelectric transformer, in which

FIG. 2 is a schematic view of the conventional circumferential oscillation mode filter, in which

FIG. 3 is an embodiment of the piezoelectric transformer according to the present invention, in which

DETAILED DESCRIPTION OF THE PREFERRED EMBODIMENT

Figure 1A:
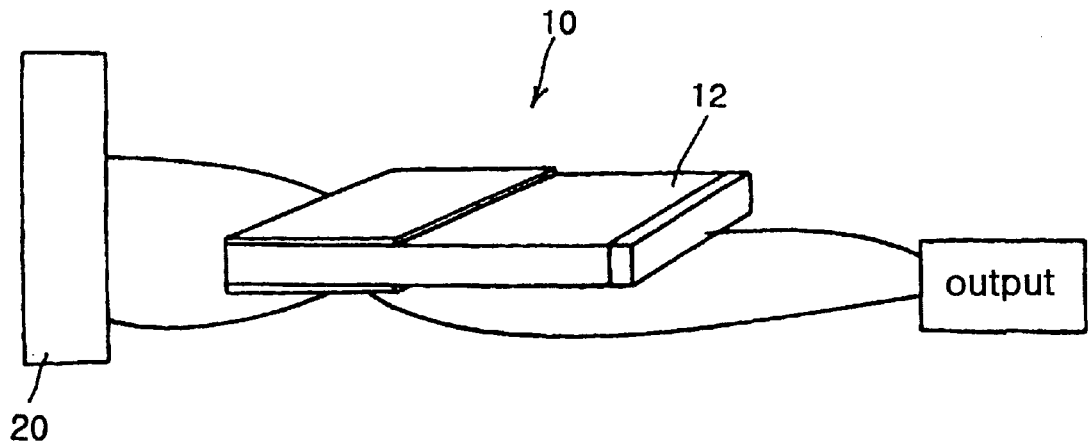
FIG. 1a is a perspective view.
Figure 1B:
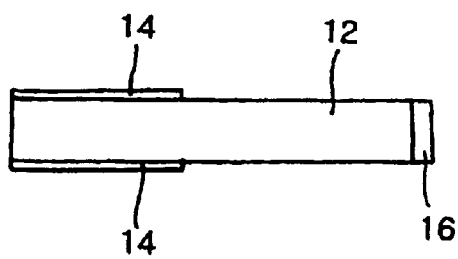
FIG. 1b is a side view.

The piezoelectric ceramic composition according to the present invention includes the following ingredients. That is, to a two-component system of $Pb(Zr,Ti)O_3$, there are added:

[1] $Pb(Mn_{1/3}Nb_{2/3})$ for increasing the mechanical quality factor Qm and the electromechanical coupling factor Kp; and

[2] $Pb(Ni_{1/2}W_{1/2})$ to form a four-component system, thereby lowering the sintering temperature, and raising the dielectric constant.

[3] As for $Pb(Mn_{1/3}Nb_{2/3})$, instead of a part of the amount of Pb, there is added Sr, so that the degradation in the temperature characteristics of the resonance frequency can be prevented, that the dielectric constant can be raised, and that the deterioration of the physical properties can be prevented even under a high voltage.

Now the reason for limiting the components in the composition of the present invention will be described.

In the component $Pb_{1-a}Sr_a$ of the four-component system piezoelectric ceramic composition according to the present invention, a should be preferably limited to 0.06 mol % or less. The reason is that if a exceeds 0.06 mol %, the curie temperature and the coercive electric field are lowered.

Further, in the component $(Ni_{1/2}W_{1/2})_b$, b should be preferably limited to 0.01–0.05 mol %, and the reason is as follows. That is, if b is less than 0.01 mol %, the sintering temperature lowering effect is dissipated, while if it exceeds 0.05 mol %, the increasing effect for the mechanical quality factor Qm and the electromechanical coupling factor Kp are lost, although the dielectric constant is increased, and although the sintering temperature is significantly lowered.

Further, in $(Mn_{1/3}Nb_{2/3})_c$, c should be preferably limited to 0.01–0.09 mol %, and the reason is as follows. That is, outside the mentioned range, there are no improvement effects for the mechanical quality factor Qm and the electromechanical coupling factor Kp.

Further, in $(Zr_{1-x}Ti_x)_x$, x should be preferably limited to 0.47–0.53 mol %, and the reason is as follows. That is, near this range, there lies the MPB (morphotropic phase boundary) (tetragonal system→perovskite system). Further, if the mentioned range is adopted, the piezoelectric properties become superior, and the temperature characteristics of the resonance frequency become excellent.

Further, in the kPbO which is added for compensating the evaporation of PbO, k should be preferably limited to 0.1–0.7 wt %. If PbO is less than 0.1 wt %, the compensation of PbO is insufficient, while at more than 0.7 wt % of PbO, it is superfluously excessive.

In the piezoelectric ceramic of the present invention, if $Fe_2O_3$ is added at 0.3 wt % or less to the four-component ceramic composition, then the coercive electric field and the curie temperature can be further raised. Further, if $CeO_2$ is added, it is precipitated to the grain boundaries to make the grains fine. If this effect is to be realized, $CeO_2$ should be preferably added at 0.25 wt % or less. Further, $CeO_2$ also acts to compensate the drop of the temperature in cooperation with $Fe_2O_3$.

Accordingly, a piezoelectric transformer with high power output capability can be obtained by using the above described piezoelectric ceramic composition.

Meanwhile, the present invention also provides a piezoelectric transformer, in which the piezoelectric ceramic composition is used to construct the transformer so that a high output is possible, and the operation is stable, by designing particular electrodes.

Figure 2A:
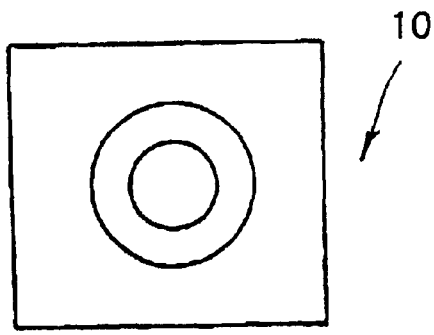
FIG. 2a is a plan view.
Figure 2B:
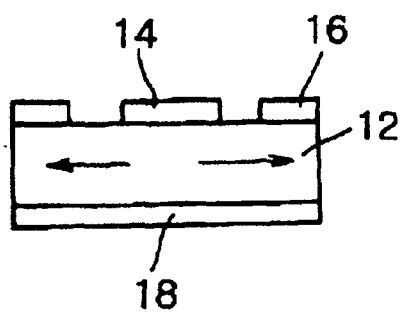
FIG. 2b is a side view.
Figure 2C:
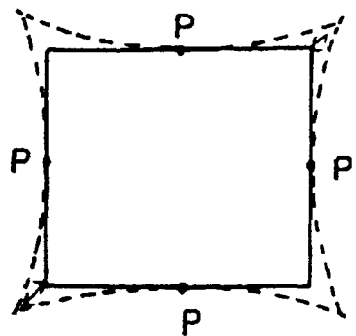
FIG. 2c illustrates the shape variations induced upon supplying a voltage.

The stepping-up of the voltage and the outputting of the stepped voltage will be described as to their principles by referring to the circumferential oscillating mode of FIG. 2.

That is, if electrical signals are inputted through the input electrode 14 and the second electrode 18, these electrical signals are converted into mechanical oscillations in the piezoelectric block 12, and then, signals proportional to the mechanical oscillations are outputted through the output electrode 16.

The mentioned oscillations of the piezoelectric block 12 are largest at the four corners (in plane view), and are smallest at the middle portions of the four edges. The arrow marks of the four corners in FIG. 2 shows the magnitudes of the oscillations.

The magnitude of the oscillations can be different depending on the chemical composition and on the level of the applied voltage. To describe it in more detail, the mechanical oscillations are largest at the four corners of the piezoelectric block 12, while the oscillations are smallest at the middle portions of the four edges. Accordingly, the center of the piezoelectric block 12 receives the largest amount of stress, and the middle portions of the four edges receive the next strong stress. Therefore, the generation of stress leads to the generation of heat at the middle portions of the edges, and consequently, the piezoelectric block 12 suffers a serious harm.

Generally, when electrical signals are inputted to be converted to mechanical oscillations, the oscillations occur most strongly near the input and output electrodes. Accordingly, if the size of the electrodes at the middle points P is reduced, then the level of the oscillations is reduced, with the result that the stress is less severely generated, thereby making it possible to prevent the generation of heat. Based on this principle, the present invention devised out an optimum pattern of the electrodes.

Figure 3A:
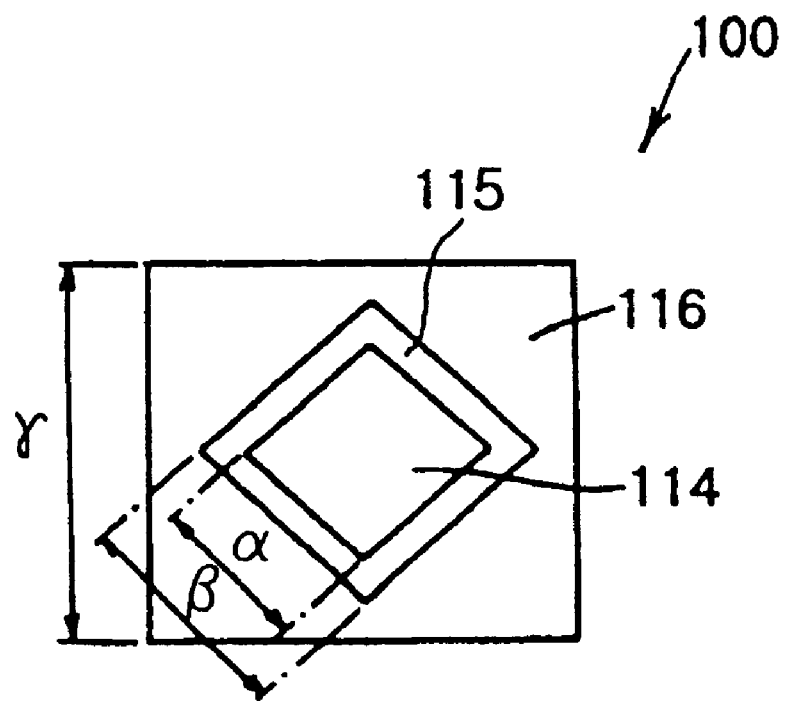
FIG. 3a is a plan view.
Figure 3B:
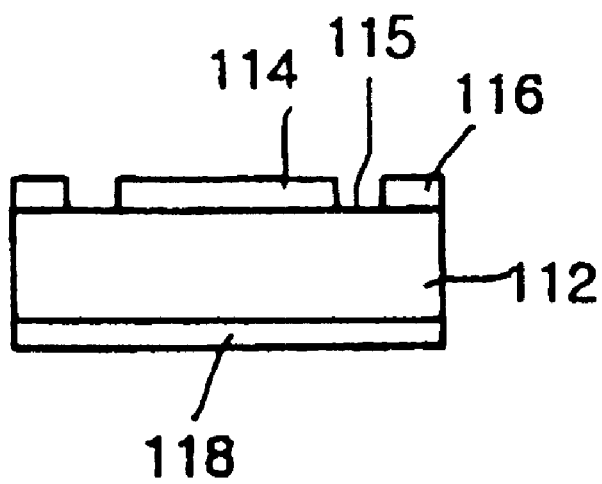
FIG. 3b is a side view.

Thus the isolating region in which the electrodes are not formed is made to approach to the minimum oscillation regions P of the piezoelectric block, so that the volumes of the electrode at the minimum oscillation regions can be reduced to the minimum. That is, the corners of the isolating regions are made nearest to the middle points of the edges of the piezoelectric block. In other words, the points of the isolating region which are nearest to the minimum oscillating points P of the edges of the piezoelectric block are farthest from the center of the piezoelectric block among all the distances from the center of the piezoelectric block to the edges of the isolating region. As shown in the example of FIG. 3, the four corners of an inner electrode 114 are made to project toward the middle points of the edges of the piezoelectric block 112. At the same time, the isolating region 115 is designed such that its four corners are most proximal to the middle points of the edges of the piezoelectric block 112. Thus the inner electrode 114 and the isolating region 115 should be preferably of the diamond shape.

If the inner electrode 114 and the isolating region 115 are designed to be of the diamond shape, then the electromechanical coupling factor Kp of the lateral direction becomes larger than the coupling factor K31 of the lengthwise direction. Therefore, the energy efficiency is improved, and the capacitance at the output side is increased, resulting in that the impedance of the output side is decreased. Accordingly, the power can be stepped up. Further, if the input electrode is designed to be of the diamond shape, the stepping-up ratio is decreased in the relative terms. Therefore, this type is advantageous for use in the fluorescent lamp in which the impedance is low during the lighting.

The first electrode which is formed on the top of the piezoelectric block 112 according to the present invention shows the minimum generation of heat, when the area ratio of the outer electrode to the inner electrode $[(\gamma^2-\beta^2)/\alpha^2)$, where $\alpha$, $\beta$ and $\gamma$ are those shown in FIG. 3] is 1.5–3.14. Further, if the inner electrode of the first electrode is made to be output electrode, and if the outer electrode is made to be input electrode to form a reverse driving type, then the transformer gives the most stable operating characteristics.

In the above, the inner electrode 114 of the first electrode was presented in the form of the diamond shape as an example, but it is not limited to this shape. In a polygonal piezoelectric block, if the portions of the electrode which are proximal to the middle points of the edges of the piezoelectric block are made small, then so much the stress received becomes smaller. As a result, the heat generation is reduced correspondingly, and the present invention is based on this principle. Accordingly, the design of the electrode can be carried out in diversified manners.

Meanwhile, the piezoelectric block can be fabricated by either the single shaft formation or by the CIP formation. In the case of the CIP formation, a high density formation is possible through the three-dimensional equi-pressure, and therefore, the internal defects are decreased, so that a uniform piezoelectric block can be obtained.

Now the present invention will be described more specifically based on actual examples.

EXAMPLE 1

PbO, $ZrO_2$, $TiO_2$, NiO, $WO_3$, $MnO_2$, $Nb_2O_5$, $Fe_2O_3$, $CeO_2$, and $SrCO_3$ were added as shown in Table 1 below. In carrying out this work, an electronic balance was used to measure the amounts of them. The measured test pieces were crushed by using zirconia balls, and after the crushing, they were dried in an electric oven. Then the dried powders were sorted by passing them through a sieve of 100 meshes, and then, they were calcinated by using an alumina crucible.

The calcinated test material was crushed again by means of the zirconia balls, and was dried again in an electric oven. The calcinated test material was passed again through a sieve of 100 meshes, and then, a PVA solution was added to it to uniformly mix them. Then the test material was fabricated by the single shaft formation or the CIP method by applying an equi-pressure of 20,000 psi. The fabricated product was baked at a temperature of 1200° C. After the baking, the test pieces were ground to a thickness of 1 mm by using sand papers and SiC powders. Then they were washed within acetone by using an ultrasonic washer. Then a silver paste was spread by a silk screening method, and then, a heat treatment was carried out. Then electrodes were formed on them, and then, electrodes were polarized based on a high temperature polarizing method. That is, after forming the electrodes, the test pieces were put into a silicon oil of 120° C., and then, an electric field of 30 kV/cm was imposed for 30 minutes, thereby polarizing the electrodes. Then the piezoelectric properties were measured, and the measured results are shown in Table 2 below.

TABLE 1

| Classifi- | $Pb_{1-a}Sr_a[(Ni_{1/2}W_{1/2})_b(Mn_{1/3}Nb_{2/3})_c(Zr_{1-x}Ti_x)_{1-b-c}]O_3$ + kPbO | | | | |
|---|---|---|---|---|---|
| cation | a | b | c | x | k |
| S1 | 0 | 0.02 | 0.07 | 0.49 | 0.5 |
| S2 | 0 | 0.02 | 0.07 | 0.50 | 0.5 |
| S3 | 0 | 0.02 | 0.07 | 0.51 | 0.5 |

TABLE 1-continued

| Classifi- | $Pb_{1-a}Sr_a[(Ni_{1/2}W_{1/2})_b(Mn_{1/3}Nb_{2/3})_c(Zr_{1-x}Ti_x)_{1-b-c}]O_3$ + kPbO | | | | |
|---|---|---|---|---|---|
| cation | a | b | c | x | k |
| S4 | 0 | 0.02 | 0.05 | 0.49 | 0.5 |
| S5 | 0 | 0.02 | 0.09 | 0.49 | 0.5 |
| S6 | 0.02 | 0.02 | 0.07 | 0.49 | 0.5 |
| S7 | 0.04 | 0.02 | 0.07 | 0.49 | 0.5 |
| S8 | 0.06 | 0.02 | 0.07 | 0.49 | 0.5 |

TABLE 2

| Classifi-cation | Dielectric constant | Kp | Qm | Ec [Kv/cm] | Tc (° C.) | Grain size |
|---|---|---|---|---|---|---|
| S1 | 1,437 | 0.585 | 1,240 | 10.35 | 325 | 3.56 |
| S2 | 1,445 | 0.549 | 1,532 | 10.5 | 328 | 4.22 |
| S3 | 1,302 | 0.503 | 1,886 | 11.25 | 345 | 4.10 |
| S4 | 1,612 | 0.591 | 1,349 | 9.75 | 340 | 5.7 |
| S5 | 1,072 | 0.546 | 1,248 | 10.5 | 313 | 3.68 |
| S6 | 1,504 | 0.571 | 1,180 | 10.25 | 308 | 4.05 |
| S7 | 1,603 | 0.547 | 1,406 | 9.75 | 285 | 4.09 |
| S8 | 1,670 | 0.523 | 1,814 | 9.15 | 272 | 4.09 |

EXAMPLE 2

Test pieces which have the composition of S8 of Example 1 were formed into three samples (S8-1, S8-2 and S8-3) of Table 3 below. Then electrode formations were carried out, and then, polarizations were carried out under an electric field of 25 KV/cm for 30 minutes, thereby manufacturing piezoelectric transformers. After leaving them for 24 hours, the impedances for the frequencies were measured by using HP4194A, and then, the resonance frequency, the semi-resonance frequency and the equivalent circuit integer were measured, the results of the measurements being shown in Table 4 below.

TABLE 3

| Classification | S8-1 (Diamond) | S8-2 (Diamond) | S8-3 (Circular) |
|---|---|---|---|
| γ | 27.5 | 31.5 | 31.5 |
| α | 13 | 17 | 14 mmφ |
| β | 15 | 19 | 16 |

TABLE 4

| Classification | | fr [kHz] | Zr [Ω] | fa [kHz] | Za [kΩ] | L [mH] | C [pF] | R [Ω] | Cd [nF] |
|---|---|---|---|---|---|---|---|---|---|
| S8-1 | Input terminal | 74.5 | 12 | 79.75 | 824.27 | 38.434 | 118.95 | 8.04 | 0.818 |
| | Output terminal | 74.375 | 3.38 | 79.75 | 206.6 | 10.08 | 454.26 | 3.33 | 3.037 |
| S8-2 | Input terminal | 63.75 | 11.12 | 69.5 | 85.85 | 15.39 | 404.75 | 3.95 | 2.137 |
| | Output terminal | 66.375 | 12.53 | 69.5 | 345.9 | 18.049 | 319.64 | 3.31 | 3.154 |

TABLE 4-continued

| Classification | | fr [kHz] | Zr [Ω] | fa [kHz] | Za [kΩ] | L [mH] | C [pF] | R [Ω] | Cd [nF] |
|---|---|---|---|---|---|---|---|---|---|
| S8-3 | Input terminal | 66.125 | 32.8 | 69.5 | 390.35 | 50.415 | 115.15 | 0 | 1.08 |
| | Output terminal | 64.125 | 6.08 | 69.5 | 123.88 | 8.579 | 1716.975 | 2.308 | 4.166 |

Figure 4:
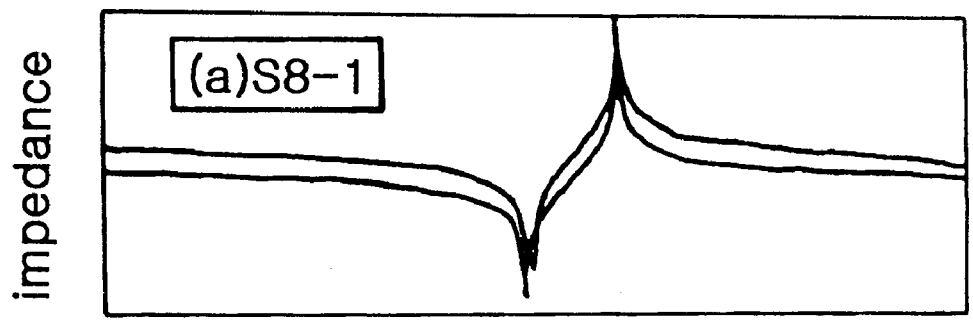
FIG. 4 is a graphical illustration showing the impedance characteristics of the piezoelectric transformer according to the present invention.
Figure 4:
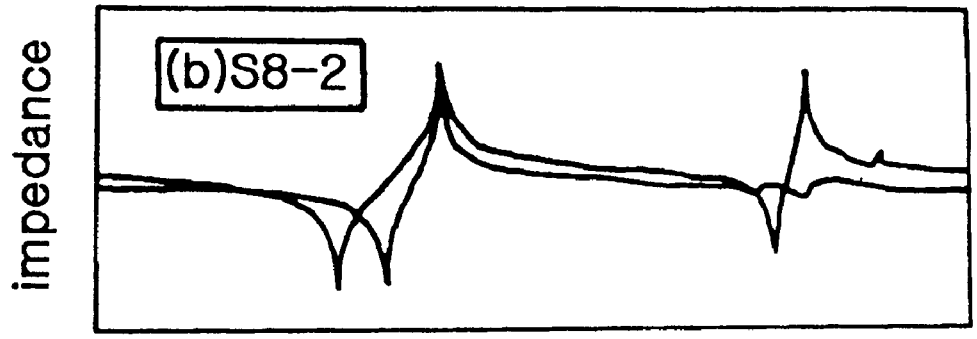
Figure 4:
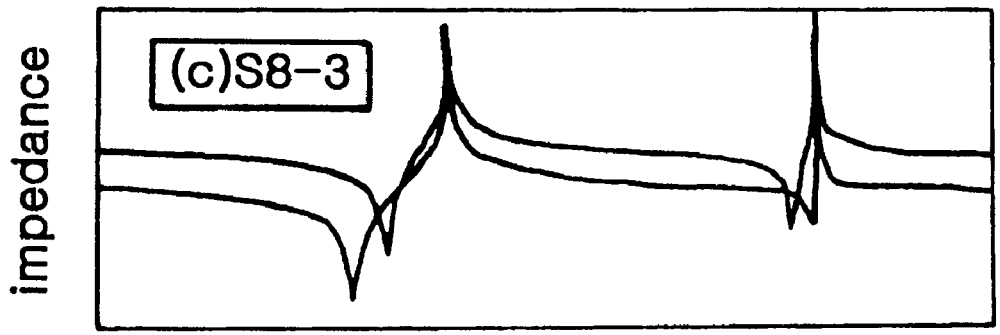

For the piezoelectric transformers of S8-1, S8-2 and S8-3 of Table 4, the shifts of the resonance frequencies with respect to the area ratios of the output terminals to the input terminals and the overall size of the transformers were observed, and the results are illustrated in FIG. 4. In FIG. 4, the solid lines are the impedance curves for the diamond shaped inner electrodes, and the dotted lines are the impedance curves for the outer electrodes. According as the area of the diamond electrode is increased, the resonance frequency is so much shifted to the left, i.e., toward the low frequency in the impedance curve of the input part. That is, according as the area of the input part is increased, ΔF[KHz] (fa–fr) of the input part is so much increased. Therefore, the electromechanical conversion efficiency is improved, so that the area oscillations would be excellent. Further, if ΔF is made to be maximum in both the input part and the output part, then the resonance frequencies of the input and output parts have to be matched to each other. In the case where the piezoelectric transformer is driven at the resonance frequency, if the resonance frequencies of the input and output parts are matched to each other, then the power output and the efficiency can be maximized. In S8-1, resonance frequencies of the input and output parts are matched to each other.

EXAMPLE 3

A fluorescent lamp of 28 W was driven for 20 minutes, and then, the input current, the input voltage, the input power, the output current, the output voltage and the output power of the transformer were measured.

As shown in Table 5 above, the characteristics were measured by varying the size of the transformer and the areas of the input and output electrodes. Here, a reverse driving method was adopted.

According as the Zout was decreased, ΔT[°C.] was tended to be gradually decreased. In S8-2, at an output power of 30 W, Zout was 1120Ω, and ΔT[°C.] was 6° C. Thus the temperature rise was not significant. In all of them, the efficiency was as high as 90% or more. In S8-3, the electrode was of a ring-dot type, and here, Zout was increased to 2012[Ω] contrastingly to the diamond shape. Further, the driving voltage was as high as 270 V, and the temperature rise was 19° C. Thus the disadvantage was serious.

S8-1 and S8-2 produced the rated output at an input voltage of about 220 V, and therefore, they are thought to be usable at 220V. The level of the input voltage greatly depends on the stepping-up ratios during the initiation of lighting and during the lighting. Further, it is also influenced by Zr of the dot and diamond.

That is, as the Zr value is large, so much the input voltage Vin is increased, and if the Vin is increased, the temperature rise is greatly affected. Accordingly, the setting of the input voltage Vin is an important design condition. Further, if the temperature rise is to be prevented, it is important that the load of the fluorescent lamp be accurately coupled to the output impedance of the transformer, this technique being important. Further, the transformer is driven at a high input voltage, and therefore, the following conditions should be satisfied for preventing the depolarization. That is, a sufficient coercive electric field and a high curie temperature

TABLE 5

| Classification | ΔT [° C.] | Driving frequency [kHz] | Size | Vin [V] | Iin [mA] | Vout [V] | Iout [mA] | Pout [W] | Efficiency [%] | Zout [Ω] |
|---|---|---|---|---|---|---|---|---|---|---|
| S8-1 (diamond) Cin = 1.3 nF Cout = 3.45 nF | 12 | 76.9 | 27.5 × 27.5 × 2.5 mm (D.S = 13 × 13 mm) | 229 | 179 | 172 | 172 | 29.58 | 94 | 1,592 |
| S8-2 (diamond) Cin = 2.05 nF Cout = 4.01 nF | 6 | 69.3 | 31.5 × 31.6 × 2.5 mm (D.S = 17 × 17 mm) | 220 | 236 | 182 | 167 | 30.39 | 92.9 | 1,120 |
| S8-3 (dot) Cin = 1.3 nF Cout = 3.45 nF | 19 | 68.2 | 31.5 × 31.6 × 2.5 mm (D.S = 14 mmφ) | 270 | 202 | 181 | 174 | 31.49 | 92.6 | 2,012 | have to be provided. Further, in order to drive a T5 (28 W) fluorescent lamp with a small transformer, a sufficient dielectric constant (more than 1500) has to be provided.

According to the present invention as described above, the four-component piezoelectric ceramic composition is superior in the dielectric constant, in the mechanical quality factor and in the electromechanical coupling factor, so as to afford a high output power. Further, the piezoelectric transformer is low in the heat generation and stable in the operation.

What is claimed is:

1. A high output power piezoelectric transformer obtained by using a piezoelectric ceramic composition satisfying $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, where a is 0–0.06 mol %, b is 0.01–0.05 mol %, c is 0.01–0.09 mol %, x is 0.47–0.53 mol %, and k is 0.1–0.7 wt %.

2. A high output power piezoelectric transformer as claimed in claim 1, said piezoelectric ceramic composition further comprising one selected from the group consisting of $Fe_2O_3$ at 0.3 wt % and $CeO_2$ at 0.25 wt %.

3. A high output power piezoelectric transformer comprising:
   a piezoelectric block composed of $Pb_{1-a}Sr_a[(Ni_{1/2}W_{1/2})_b(Mn_{1/3}Nb_{2/3})_c(Zr_{1-x}Ti_x)_{1-b-c}]O_3+kPbO$, (where a is 0–0.06 mol %, b is 0.01–0.05 mol %, c is 0.01–0.09 mol %, x is 0.47–0.53 mol %, and k is 0.1–0.7 wt %.);
   a first electrode consisting of an inner electrode and an outer electrode, said inner electrode being formed at a center of a top of said piezoelectric block, and said outer electrode being formed around said inner electrode by being separated by an isolating region; and
   a second electrode formed on a bottom of said piezoelectric block.

4. The high output power piezoelectric transformer as claimed in claim 3, wherein said piezoelectric block is manufactured by a CIP fabrication method.

5. The high output power piezoelectric transformer as claimed in claim 3, said piezoelectric block further composed of one selected from the group consisting of $Fe_2O_3$ at 0.3 wt % and $CeO_2$ at 0.25 wt %.

6. The high output power piezoelectric transformer as claimed in claim 3, wherein points of said isolating region nearest to minimum oscillating points P of said piezoelectric block are farthest from a center of said piezoelectric block among all distances from the center of said piezoelectric block to edges of said isolating region.

7. The high output power piezoelectric transformer as claimed in claim 6, wherein said isolating region is of a diamond shape.

8. The high output power piezoelectric transformer as claimed in claim 3, wherein said inner electrode is an output electrode, and said outer electrode is an input electrode, to form a reverse driving type.

9. The high output power piezoelectric transformer as claimed in any one of claims 3 to 8, wherein a ratio of said outer electrode to said inner electrode $(\gamma^2-\beta^2)/\alpha^2$ is 1.5–3.14.

10. The high output power piezoelectric transformer as claimed in any one of claims 3 to 8, wherein said piezoelectric block is polygonal, and middle points of edges of said block are minimum oscillation regions.

* * * * *